US010224652B2

(12) United States Patent
Herring et al.

(10) Patent No.: US 10,224,652 B2
(45) Date of Patent: Mar. 5, 2019

(54) CARD EDGE CONNECTOR ASSEMBLY (71) Applicant: TE CONNECTIVITY CORPORATION, Berwyn, PA (US)

(72) Inventors: Michael David Herring, Apex, NC (US); Michael John Phillips, Camp Hill, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/447,824

(22) Filed: Mar. 2, 2017

(65) Prior Publication Data

US 2018/0254571 A1 Sep. 6, 2018

(51) Int. Cl.
| H01R 12/00 | (2006.01) |
| H05K 1/00 | (2006.01) |
| H01R 12/72 | (2011.01) |
| H01R 12/70 | (2011.01) |
| H01R 33/97 | (2006.01) |
| H05K 5/02 | (2006.01) |
| H05K 7/14 | (2006.01) |
| H01R 12/73 | (2011.01) |
| H01R 13/629 | (2006.01) |

(52) U.S. Cl.
CPC ....... H01R 12/721 (2013.01); H01R 12/7005 (2013.01); H01R 12/73 (2013.01); H01R 12/737 (2013.01); H01R 13/629 (2013.01); H01R 33/97 (2013.01); H05K 5/0291 (2013.01); H05K 7/1404 (2013.01)

(58) Field of Classification Search
CPC .. H01R 12/51; H01R 12/7005; H01R 13/629; H01R 13/62905

USPC .................................................. 439/64, 377
See application file for complete search history.

(56) References Cited

U.S. PATENT DOCUMENTS

| 3,801,953 | A | * | 4/1974 | Lynch | .................... | H01R 23/68 439/377 |
| 3,932,016 | A | * | 1/1976 | Ammenheuser | ..... | H05K 7/1418 361/801 |
| 4,998,887 | A | * | 3/1991 | Kaufman | .............. | H01R 12/716 439/248 |
| 5,037,323 | A | * | 8/1991 | Locati | .................. | H01R 13/631 439/374 |
| 5,980,299 | A | | 11/1999 | Davis | | |
| 6,030,251 | A | * | 2/2000 | Stark | .................. | H01R 12/7005 439/377 |
| 6,039,581 | A | * | 3/2000 | DiMarco | .............. | H01R 12/716 439/74 |
| 6,045,385 | A | | 4/2000 | Kane | | |

(Continued)

Primary Examiner — Hae Moon Hyeon (57) ABSTRACT

A card edge connector assembly includes a card edge connector having a housing defining a card slot configured to receive a paddle card of a pluggable module and having a mounting lug having a datum surface. The card edge connector assembly includes support hardware coupled to the housing having a base including a locating cavity having a locating surface that receives the mounting lug such that the locating surface engages the datum surface of the mounting lug to locate the support hardware relative to the housing at a support location. The support hardware has a support beam extending from the base having a support surface for supporting the pluggable module independent of the card edge connector such that the paddle card is oriented in the card slot relative to the contacts for electrical connection therewith.

23 Claims, 7 Drawing Sheets

(56) References Cited

U.S. PATENT DOCUMENTS

| | | | |
|---|---|---|---|
| 6,083,026 A | 7/2000 | Trout et al. | |
| 6,160,706 A | 12/2000 | Davis et al. | |
| 6,168,450 B1 | 1/2001 | Davis et al. | |
| 6,332,792 B1 * | 12/2001 | Lin | H05K 7/1431 |
| | | | 439/160 |
| 6,722,908 B2 * | 4/2004 | Llapitan | H01L 23/4093 |
| | | | 257/E23.086 |
| 8,425,250 B2 * | 4/2013 | Kagotani | H01R 13/60 |
| | | | 439/374 |
| 8,475,195 B2 | 7/2013 | Annis et al. | |

* cited by examiner

CARD EDGE CONNECTOR ASSEMBLY

BACKGROUND OF THE INVENTION

The subject matter herein relates generally to card edge connector assemblies.

Card edge connectors are used in various system applications. For example, card edge connectors are typically mounted to a host circuit board. The card edge connectors include card slots for receiving a card edge of a paddle card of a pluggable module. The pluggable module are typically stand-alone modules including electrical components thereon, such as memory, processors and the like forming electrical circuits and interacting with the host circuit board. The card edge connectors are designed for supporting the stand-alone pluggable modules.

Some system components need to be electrically connected to other components by cables. For example, header connectors may be mounted to the circuit board that electrically connect to cabled receptacle connectors. The header connectors and receptacle connectors typically have different footprints, different characteristics and different requirements than card edge connectors. For example, when installed, the cabled receptacle connectors may be subjected to stresses and strains, such as pulling forces on the cables, which are transferred to the header connector. The header connector is mounted to the host circuit board with sufficient structural stability to withstand the forces from the cabled receptacle connectors. Conventional card edge connectors are not mounted to the circuit board with sufficient structural stability to withstand forces from cable mounted pluggable modules.

Because real estate on the host circuit board is precious, it may be expensive to provide both card edge connectors and header connectors on the same circuit board to accommodate both non-cabled pluggable modules and cabled receptacle connectors. A need remains for an electrical connector that accommodates non-cabled pluggable modules and cabled receptacle connectors.

BRIEF DESCRIPTION OF THE INVENTION

In one embodiment, a card edge connector assembly is provided including a card edge connector having a housing defining a card slot configured to receive a paddle card of a pluggable module. The housing has a base configured to be mounted to a host circuit board. The housing holds contacts in the card slot to electrically connect to the paddle card. The contacts are configured to be electrically connected to the host circuit board. The housing has a mounting lug having a datum surface. The card edge connector assembly includes support hardware coupled to the housing. The support hardware has a base including a locating cavity having a locating surface. The locating cavity receives the mounting lug and the locating surface engages the datum surface of the mounting lug to locate the support hardware relative to the housing at a support location. The base is configured to be secured to the host circuit board at the support location. The support hardware has a support beam extending from the base having a support surface configured to support the pluggable module independent of the card edge connector such that the paddle card is oriented in the card slot relative to the contacts for electrical connection therewith.

In another embodiment, a card edge connector assembly is provided including a pluggable module having a pluggable body holding a paddle card at a mating end of the pluggable body. The paddle card has a card edge including contact pads. The pluggable body has a first side and a second side extending between a first end and a second end. The pluggable body has a first mounting arm at the first end and a second mounting arm at the second end. The card edge connector assembly includes a card edge connector having a housing defining a card slot receiving the card edge of the paddle card. The housing has a base configured to be mounted to a host circuit board. The housing holds contacts in the card slot to electrically connect to corresponding contact pads of the paddle card that are configured to be electrically connected to the host circuit board. The housing has a first side and a second side extending between a first end and a second end. The housing has a first mounting lug at the first end and a second mounting lug at the second end. The first mounting lug has a first datum surface and the second mounting lug has a second datum surface. The card edge connector assembly includes a first support hardware coupled to the first mounting lug. The first support hardware has a base including a locating cavity having a first locating surface that receives the first mounting lug such that the first locating surface engages the first datum surface to locate the first support hardware relative to the housing at a first support location. The base is configured to be secured to the host circuit board at the first support location. The first support hardware has a first support beam extending from the base having a first support surface engaging the first mounting arm of the pluggable body to support the first end of the pluggable body. The card edge connector assembly includes a second support hardware coupled to the second mounting lug. The second support hardware has a base including a locating cavity having a second locating surface that receives the second mounting lug such that the second locating surface engages the second datum surface to locate the second support hardware relative to the housing at a second support location. The base is configured to be secured to the host circuit board at the second support location. The second support hardware has a second support beam extending from the base having a second support surface engaging the second mounting arm of the pluggable body to support the second end of the pluggable body. The first and second support beams support the pluggable module independent of the card edge connector.

In a further embodiment, a card edge connector assembly having at least a first configuration and a second configuration is provided including a card edge connector having a housing defining a card slot configured to receive a paddle card of a pluggable module. The housing has a base configured to be mounted to a host circuit board. The housing holds contacts in the card slot to electrically connect to the paddle card and that are configured to be electrically connected to the host circuit board. The housing has a mounting lug having a datum surface. Support hardware is removably and selectively coupled to the housing. In the first configuration, the support hardware is removed from the housing and not utilized. In the second configuration, the support hardware is coupled to the housing. The support hardware has a base including a locating cavity having a locating surface, the locating cavity receiving the mounting lug in the second configuration. The locating surface engages the datum surface of the mounting lug to locate the support hardware relative to the housing at a support location. The base is configured to be coupled to the host circuit board at the support location. The support hardware has a support beam extending from the base having a support surface configured to support the pluggable module independent of the card edge connector such that the paddle card is oriented in the card slot relative to the contacts for electrical connection therewith. In the first configuration, the card edge connector assembly has a first footprint above the host circuit board having a first surface area defined substantially by a footprint of the housing. In the second configuration when the support hardware is coupled to the housing, the card edge connector assembly has a second footprint above the host circuit board having a second surface area defined substantially by the footprint of the housing and a footprint of the support hardware such that the second surface area is larger than the first surface area. In the first configuration, the card edge connector is configured to be coupled to a non-cabled pluggable module with the non-cabled pluggable module engaging and being supported by the card edge connector. In the second configuration, the card edge connector is configured to be coupled to a cabled pluggable module with the cabled pluggable module engaging and being supported by the support hardware independent of the card edge connector.

DETAILED DESCRIPTION OF THE INVENTION

Figure 1:
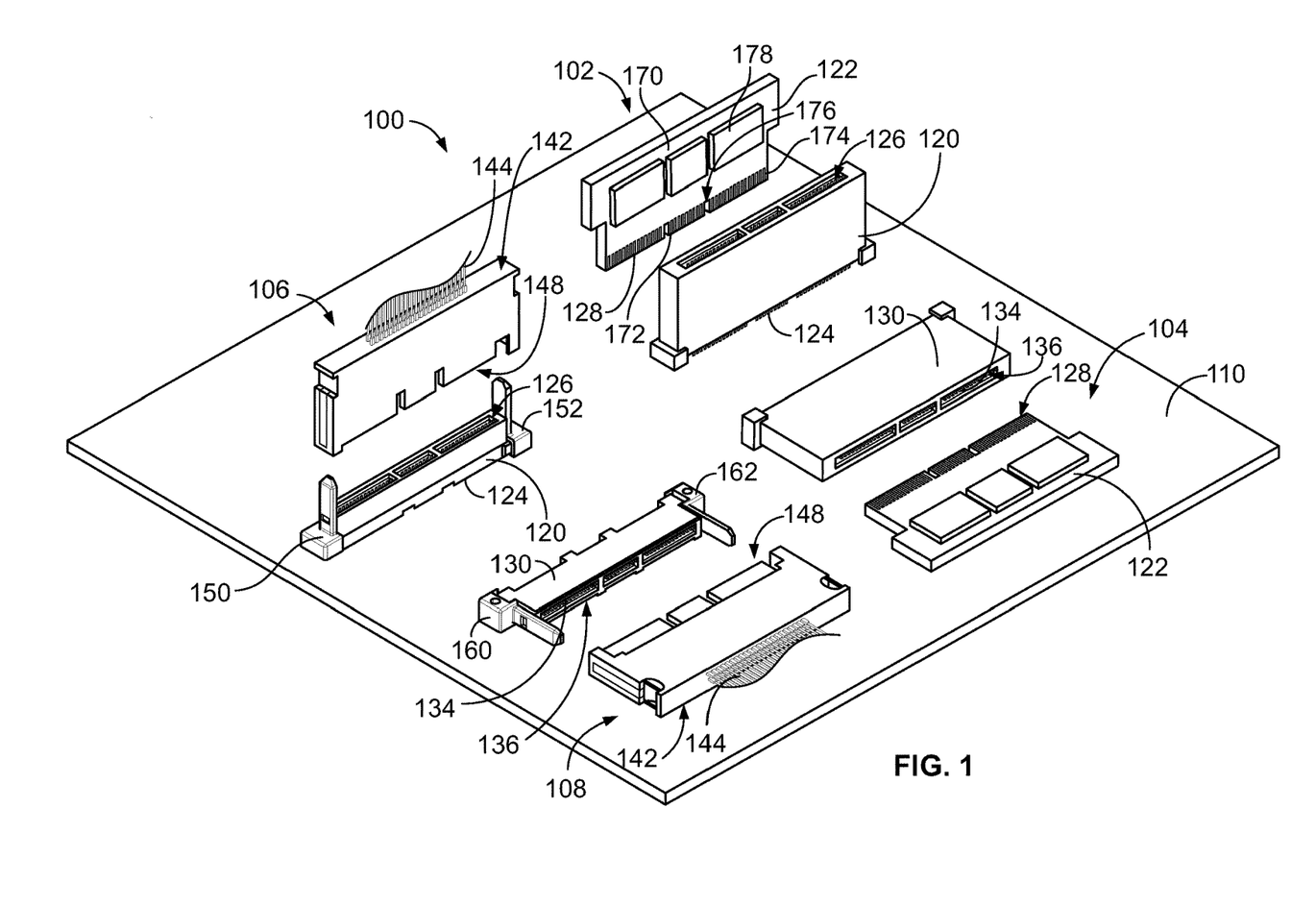
FIG. 1 is a perspective view of an electrical system showing various card edge connector assemblies in accordance with an exemplary embodiment showing the card edge connector assemblies in unmated positions.
Figure 2:
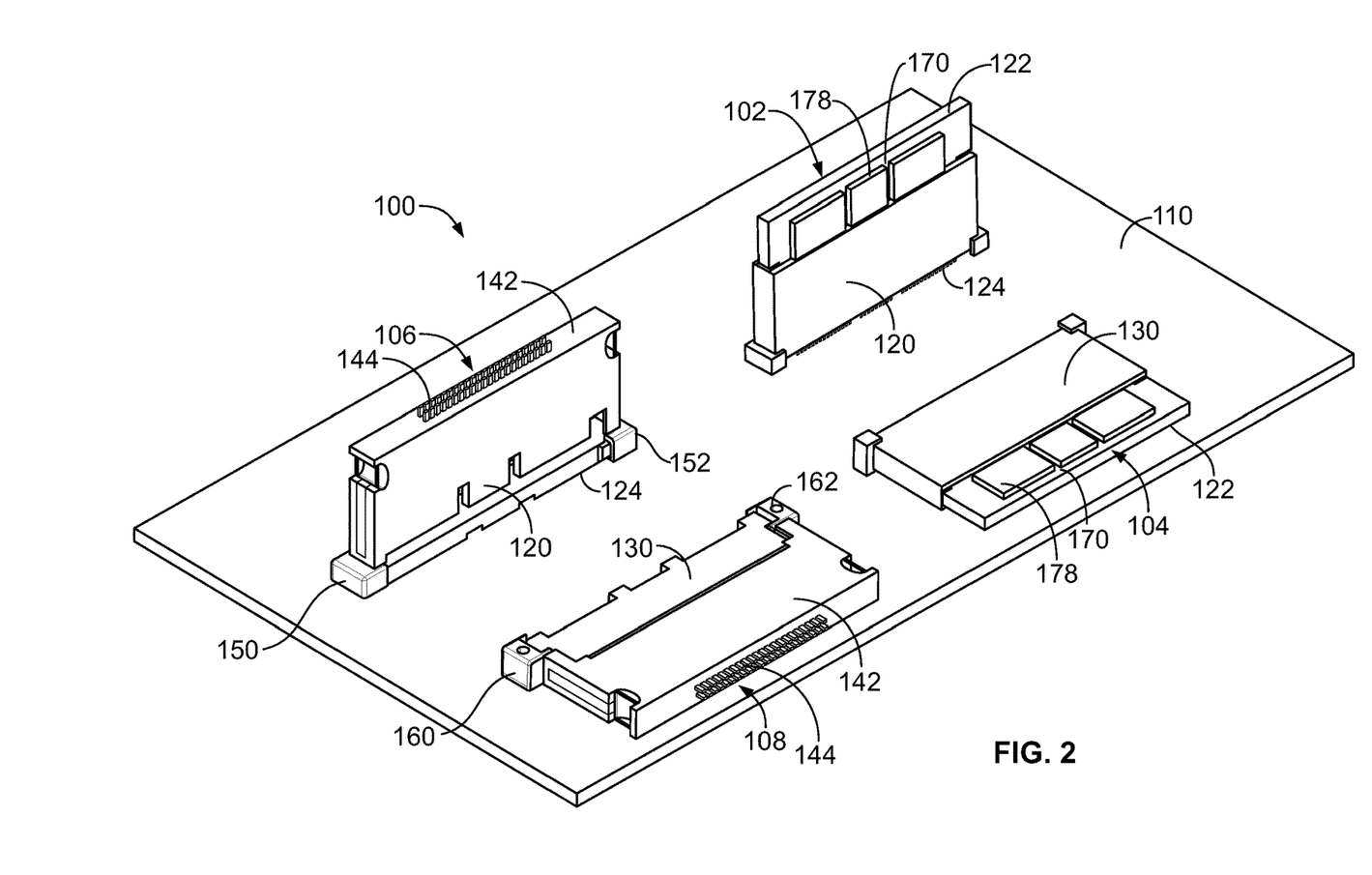
FIG. 2 is a perspective view of the electrical system showing the card edge connector assemblies in mated positions.

FIG. 1 is a perspective view of an electrical system 100 showing various card edge connector assemblies 102, 104, 106, 108 in accordance with an exemplary embodiment showing the card edge connector assemblies 102, 104, 106, 108 in unmated positions. FIG. 2 is a perspective view of the electrical system 100 showing the card edge connector assemblies 102, 104, 106, 108 in mated positions. The card edge connector assemblies 102, 104, 106, 108 are mounted to a host circuit board 110. While FIGS. 1 and 2 illustrate four different types of card edge connector assemblies having some similar components, it is realized that any number of any of the card edge connector assemblies 102, 104, 106, 108 may be utilized within the system 100. For example, in various embodiments, only one card edge connector assembly 102, 104, 106 or 108 may be used, only one type of card edge connector assembly 102, 104, 106 or 108 may be used with multiple of such card edge connector assembly 102, 104, 106 or 108 mounted to the circuit board 110, or more than one type of card edge connector assemblies 102, 104, 106 and/or 108 may be mounted to the circuit board 110.

In the illustrated embodiment, the card edge connector assembly 102 is a vertical, non-cabled card edge connector assembly; the card edge connector assembly 104 is a horizontal, non-cabled card edge connector assembly; the card edge connector assembly 106 is a vertical, cabled card edge connector assembly; the card edge connector assembly 108 is a horizontal, cabled card edge connector assembly. Other types of card edge connector assemblies may be utilized in alternative embodiments. The card edge connector assemblies 102, 104, 106, 108 include similar components and like components may be identified using like names and like reference numbers. Not every card edge connector assembly 102, 104, 106, 108 is described herein in the same amount of detail and components described herein with reference to one of the card edge connector assemblies 102, 104, 106, 108 may be applicable to other card edge connector assemblies 102, 104, 106, 108.

The card edge connector assembly 102 includes a card edge connector 120 and a non-cabled pluggable module 122 (which may be referred to hereinafter simply as pluggable module 122). The card edge connector 120 is configured to be mounted to the host circuit board 110, such as by soldering contacts 124 of the card edge connector 120 to the host circuit board 110. The card edge connector 120 has a mating end 126 configured to receive a mating end 128 of the non-cabled pluggable module 122. The mating end 126 is provided at a top of the card edge connector 120 to receive the non-cabled pluggable module 122 in a generally vertical mating direction, such as a mating direction perpendicular to the host circuit board 110.

The card edge connector assembly 104 includes a card edge connector 130 and the non-cabled pluggable module 122 (while the same pluggable module 122 is illustrated in FIGS. 1 and 2, it is realized that the card edge connector assembly 104 may be configured to mate with a different type of pluggable module). The card edge connector 130 is configured to be mounted to the host circuit board 110, such as by soldering contacts 134 of the card edge connector 130 to the host circuit board 110. The card edge connector 130 has a mating end 136 configured to receive the mating end 128 of the non-cabled pluggable module 122. The mating end 136 is provided at a front of the card edge connector 130 to receive the non-cabled pluggable module 122 in a generally horizontal mating direction, such as a mating direction parallel to the host circuit board 110.

The card edge connector assembly 106 includes the card edge connector 120 (while the same card edge connector 120 is illustrated in FIGS. 1 and 2, it is realized that the card edge connector assembly 106 may include a different type of card edge connector in alternative embodiments) and a cabled pluggable module 142 having cables 144 extending therefrom (which may be referred to hereinafter simply as pluggable module 142). The card edge connector assembly 106 includes support members for the cabled pluggable module 142, such as first and second support hardware 150, 152 configured to be mounted to the host circuit board 110 adjacent opposite ends of the card edge connector 120 to provide guidance and support for the cabled pluggable module 142. The support hardware 150, 152 may be referred to as vertical support hardware because the supporting portion of the support hardware 150, 152 extends generally vertically. The support hardware 150, 152 may alleviate stress or strain on the card edge connector 120 from the cable pluggable module 142, such as from pulling forces on the cables 144. The mating end 126 of the card edge connector 120 is configured to receive a mating end 148 of the cabled pluggable module 142. The mating end 126 receives the cabled pluggable module 142 in a generally vertical mating direction, such as a mating direction perpendicular to the host circuit board 110. The cables 144 exit the pluggable module 142 generally opposite the card edge connector 120, such as vertically from the top thereof; however, the cables 144 may exit from other portions of the pluggable module 142 or in other directions, such as horizontally.

The card edge connector assembly 108 includes the card edge connector 130 (while the same card edge connector 130 is illustrated in FIGS. 1 and 2, it is realized that the card edge connector assembly 108 may include a different type of card edge connector in alternative embodiments) and the cabled pluggable module 142 having the cables 144 extending therefrom. The card edge connector assembly 108 includes support members for the cabled pluggable module 142, such as first and second support hardware 160, 162 configured to be mounted to the host circuit board 110 adjacent opposite ends of the card edge connector 130 to provide guidance and support for the cabled pluggable module 142. The support hardware 160, 162 may be referred to as horizontal support hardware because the supporting portion of the support hardware 160, 162 extends generally horizontally. The support hardware 160, 162 may alleviate stress or strain on the card edge connector 130 from the cable pluggable module 142, such as from pulling forces on the cables 144. The mating end 136 receives the cabled pluggable module 142 in a generally horizontal mating direction, such as a mating direction parallel to the host circuit board 110. The cables 144 exit the pluggable module 142 generally opposite the card edge connector 130, such as horizontally; however, the cables 144 may exit from other portions of the pluggable module 142 or in other directions, such as vertically away from the host circuit board 110.

In an exemplary embodiment, the non-cabled pluggable module 122 is a standalone pluggable module configured to be mated with the card edge connector 120 or the card edge connector 130 without being electrically connected to another component, such as through a cabled connection. In various embodiments, the only interface the pluggable module 122 has with another component is through the card edge connector 120 or 130. The pluggable module 122 includes a paddle card 170 having a card edge 172 at the mating end 128 configured to be loaded into the card edge connector 120 or 130. The paddle card 170 has a plurality of contact pads 174 at the card edge 172 configured to be electrically connected to the card edge connector 120 or 130. In an exemplary embodiment, the paddle card 170 includes one or more alignment slots 176 in the card edge 172 for locating the paddle card 170 within the card edge connector 120 or 130.

The pluggable module 122 includes one or more electrical components 178 mounted to the paddle card 170. For example, the electrical components 178 may include a memory, a processor, or other types of electrical components. The electrical components 178 are electrically connected to corresponding contact pads 174. The paddle card 170 includes various circuits transmitting data and/or power between the contact pads 174 and the electrical components 178. In various embodiments, in a simple form, the pluggable module 122 simply includes the paddle card 170 with the various electrical components 178 without any other structure. In other various embodiments, the pluggable module 122 may include a pluggable body, such as a housing, surrounding the paddle card 170 and/or the electrical components 178. The pluggable body may include one or more heat sinks for dissipating heat from the electrical components 178.

Figure 3:
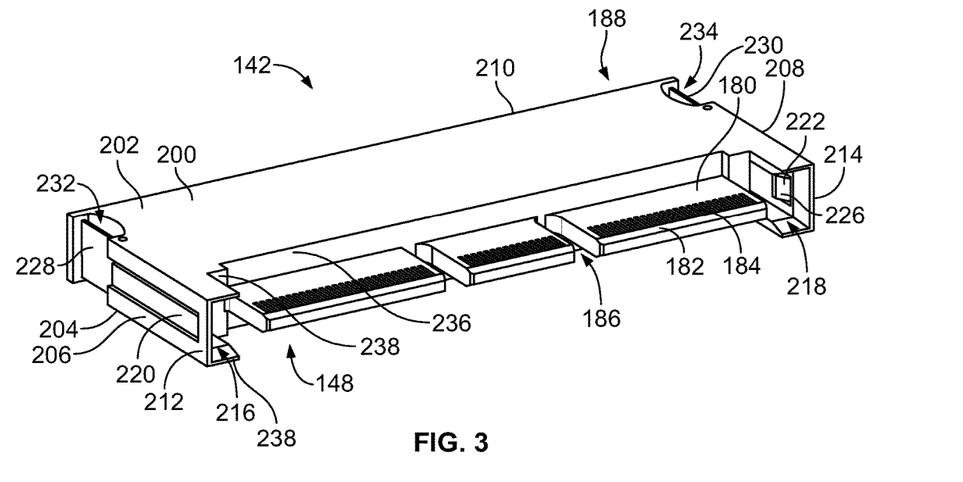
FIG. 3 is a perspective view of a cabled pluggable module in accordance with an exemplary embodiment.
Figure 4:
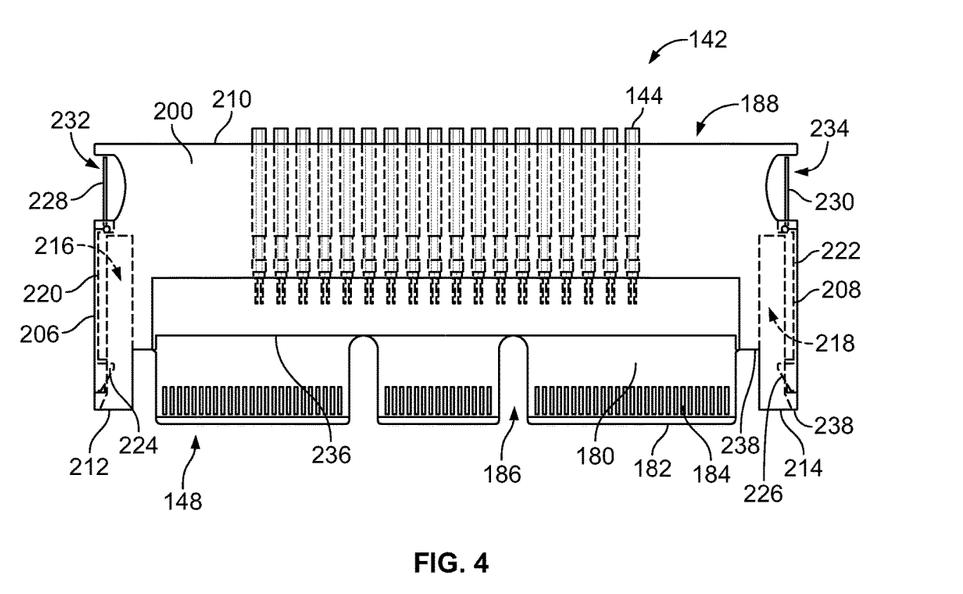
FIG. 4 is a side view of the cabled pluggable module in accordance with an exemplary embodiment.

FIG. 3 is a perspective view of the cabled pluggable module 142 in accordance with an exemplary embodiment. FIG. 4 is a side view of the cabled pluggable module 142 in accordance with an exemplary embodiment. The cabled pluggable module 142 includes the cables 144 to electrically connect the pluggable module 142 to another component remote form the pluggable module 142 within the electrical system 100. The pluggable module 142 interfaces with the cables 144 and with the corresponding card edge connector 120 or 130 (shown in FIG. 1) to electrically connect the corresponding card edge connector 120 or 130 with another component, such as another connector, through the cables 144.

The pluggable module 142 includes a paddle card 180 having a card edge 182 at the mating end 148 configured to be loaded into the card edge connector 120 or 130. The paddle card 180 has a plurality of contact pads 184 at the card edge 182 configured to be electrically connected to the card edge connector 120 or 130. In an exemplary embodiment, the paddle card 180 includes one or more alignment slots 186 in the card edge 182 for locating the paddle card 180 within the card edge connector 120 or 130.

The cables 144 are terminated to a cable end 188 of the paddle card 180 generally opposite the mating end 148. For example, the cables 144 may be soldered to the paddle card 180. The paddle card 180 includes various circuits transmitting data and/or power between the contact pads 184 and the cables 144. In various embodiments, the pluggable module 142 does not include separate electrical components (for example, memory, processors, and the like) on the paddle card 180, but rather is electrically connected to corresponding electrical components via the cables 144. In other various embodiments, the paddle card 180 may include electrical components thereon.

The pluggable module 142 includes a pluggable body 200 configured to hold the paddle card 180 and/or the cables 144. For example, the pluggable body 200 may be an overmolded body molded around the cable end 188 of the paddle card 180 and ends of the cables 144. The pluggable body 200 provides strain relief for the cables 144. In an exemplary embodiment, the card edge 182 of the paddle card 180 is exposed beyond an end of the pluggable body 200.

In an exemplary embodiment, the pluggable body 200 includes a first side 202 and a second side 204 extending between a first end 206 and a second end 208. The pluggable body 200 extends between the mating end 148 and a cable end 210 opposite the mating end 148. The cables 144 exit the pluggable body 200 at the cable end 210. In an exemplary embodiment, the pluggable body 200 includes a first mounting arm 212 at the first end 206 and a second mounting arm 214 at the second end 208. The mounting arms 212, 214 are used for mounting the pluggable module 142 to the corresponding support hardware 150, 152 or 160, 162 (shown in FIG. 1). For example, the mounting arms 212, 214 may include tracks 216, 218, respectively that receive portions of the support hardware 150, 152 or 160, 162. The tracks 216, 218 may be C-shaped configured to extend along opposite sides at an end of the support hardware 150, 152 or 160, 162 to resist end-to-end and side-to-side movement of the pluggable module 142.

In an exemplary embodiment, the pluggable module 142 includes first and second latches 220, 222 at the first and second ends 206, 208, respectively. The latches 220, 222 may extend along or through the mounting arms 212, 214, respectively. The latches 220, 222 include latching ends 224, 226, respectively. The latching ends 224, 226 are configured to be latchably coupled to the support hardware 150, 152 or 160, 162. The latches 220, 222 include release levers 228, 230, respectively. The release levers 228, 230 are provided in openings 232, 234 in the first and second ends 206, 208, respectively, of the pluggable body 200. The release levers 228, 230 may release the latching ends 224, 226 by squeezing inward. Other types of latches may be used in alternative embodiments.

In an exemplary embodiment, the pluggable body 200 includes a front edge 236 at the mating end 148. The card edge 182 of the paddle card 180 extends forward of the front edge 236. In an exemplary embodiment, the mounting arms 212, 214 extend forward of the front edge 236 along opposite ends of the paddle card 180. The pluggable body 200 includes one or more front stop surfaces 238, such as at the distal ends of the mounting arms 212, 214 and/or at or near the front edge 236. The front stop surfaces 238 may be defined by shoulders extending forward of the front edge 236, such as at or near the mounting arms 212, 214. The front stop surfaces 238 are configured to engage the card edge connector 120 or 130 when the pluggable module 122 is mated thereto. The front stop surfaces 238 may rest against the support hardware 150, 152 or 160, 162 and/or the card edge connector 120 or 130.

Figure 5:
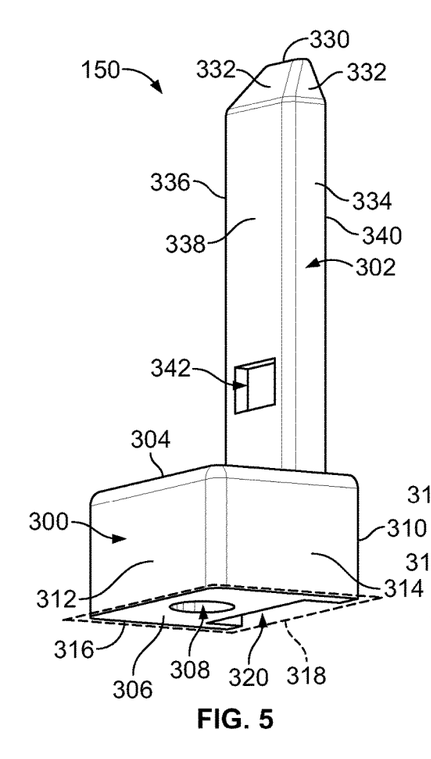
FIG. 5 is a bottom perspective view of support hardware for various card edge connector assemblies in accordance with an exemplary embodiment.
Figure 6:
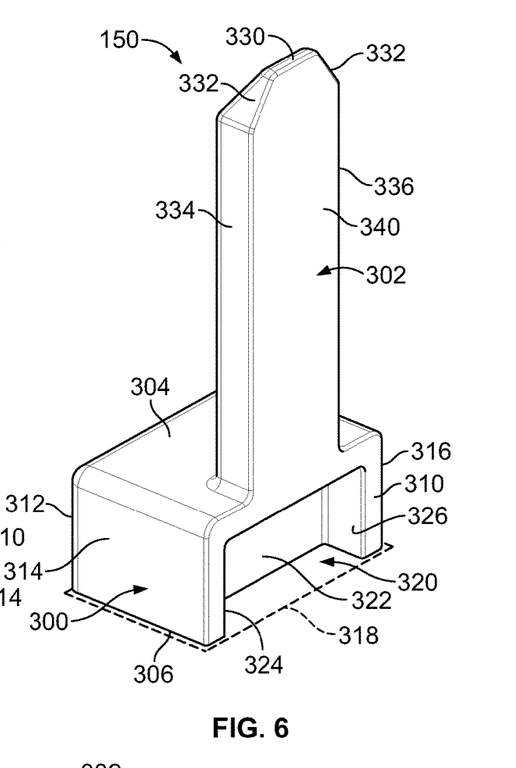
FIG. 6 is a perspective view of the support hardware shown in FIG. 5.

FIG. 5 is a bottom perspective view of the support hardware 150 in accordance with an exemplary embodiment. FIG. 6 is a perspective view of the support hardware 150 in accordance with an exemplary embodiment. Optionally, the first support hardware 150 may be identical to the second support hardware 152 (shown in FIG. 1) and thus features of the second support hardware 152 are described herein with reference to the first support hardware 150. For example, in an exemplary embodiment, the support hardware 150, 152 are hermaphroditic and may be coupled to either end of the card edge connector 120 (shown in FIG. 1). Alternatively, rather than being identical, the components may be designed with a right-hand version and a left-hand version, which may be mirrored versions, for coupling to the opposite ends of the card edge connector 120.

The support hardware 150 includes a base 300 configured to be mounted to the host circuit board 110 (shown in FIG. 1) and a support beam 302 extending from the base 300. In an exemplary embodiment, the support hardware 150 is vertical support hardware configured to extend vertically (for example, perpendicular to the host circuit board 110) and be coupled to the pluggable module 142 in a vertical mating direction. The support beam 302 extends from a top 304 of the base 300. The top 304 is generally opposite a bottom 306 of the base 300, which is configured to be mounted to the host circuit board 110. In an exemplary embodiment, the bottom 306 includes a mounting feature 308 for mounting the base 300 to the host circuit board 110. In the illustrated embodiment, the mounting feature 308 is a threaded opening configured to receive mounting hardware, such as a fastener, such as a threaded screw. Other types of mounting features may be provided in alternative embodiments, such as a non-threaded opening, a post, a barb, a solder feature, and the like.

The base 300 includes an inner end 310 configured to face the card edge connector 120, an outer end 312 opposite the inner end 310, and opposite sides 314, 316 extending between the inner and outer ends 310, 312. The base 300 is generally box-shaped; however, the base 300 may have other shapes in alternative embodiments including other portions. The support hardware 150 has a footprint 318 defined by the ends 310, 312 and the sides 314, 316 configured to occupy a space above the host circuit board 110. In an exemplary embodiment, the support beam 302 extends from the base 300 at or near the inner end 310 and the mounting feature 308 is provided at the bottom 306 near the outer end 312.

The base 300 includes a locating cavity 320 having one or more locating surfaces 322, 324, 326 configured to locate the support hardware 150 relative to the card edge connector 120. In an exemplary embodiment, the locating cavity 320 is provided at the inner end 310 and at the bottom 306. The locating cavity 320 is open at the inner end 310 and at the bottom 306 to receive a portion of the card edge connector 120. In the illustrated embodiment, the locating cavity 320 is generally rectangular in shape; however, the locating cavity 320 may have other shapes in alternative embodiments. In the illustrated embodiment, the locating cavity 320 includes an end locating surface 322, a first side locating surface 324 near the first side 314 and a second side locating surface 326 near the second side 316. The locating surfaces 322, 324, 326 are configured to engage the card edge connector 120 to register the location of the support hardware 150 relative to the card edge connector 120. The side locating surfaces 324, 326 may guide side-to-side positioning of the support hardware 150 relative to the card edge connector 120. The end locating surface 322 may guide end-to-end positioning of the support hardware 150 relative to the card edge connector 120.

The support beam 302 extends from the base 300 to a distal end 330. The support beam 302 is used to guide mating of the pluggable module 142 to the support hardware 150. The support beam 302 supports the pluggable module 142 to alleviate stresses and strains on the card edge connector 120, such as from pulling on the cables 144 of the pluggable module 142 by transferring the stresses and strains to the base 300 and the host circuit board 110. In an exemplary embodiment, the support beam 302 includes a lead-in 332 at the distal end 330. For example, the support beam 302 may be chamfered along a first side 334, a second side 336, an outer end 338 and/or an inner end 340. The lead-in 332 at the first side 334 and/or the second side 336 may guide side-to-side positioning of the pluggable module 142 during mating. The lead-in 332 at the outer end 338 and/or the inner end 340 may guide end-to-end positioning of the pluggable module 142 during mating.

In an exemplary embodiment, the support beam 302 includes a latching feature 342 for securing the pluggable module 142 to the support hardware 150. In the illustrated embodiment, the latching feature 342 is an opening in the support beam 302 at the outer end 338. Other types of latching features may be provided in alternative embodiments, such as a deflectable latch extending from the support beam 302. The latching feature 342 may be located at a different position on the support beam 302 or may be located on the base 300 in alternative embodiments.

Figures 7, 8:
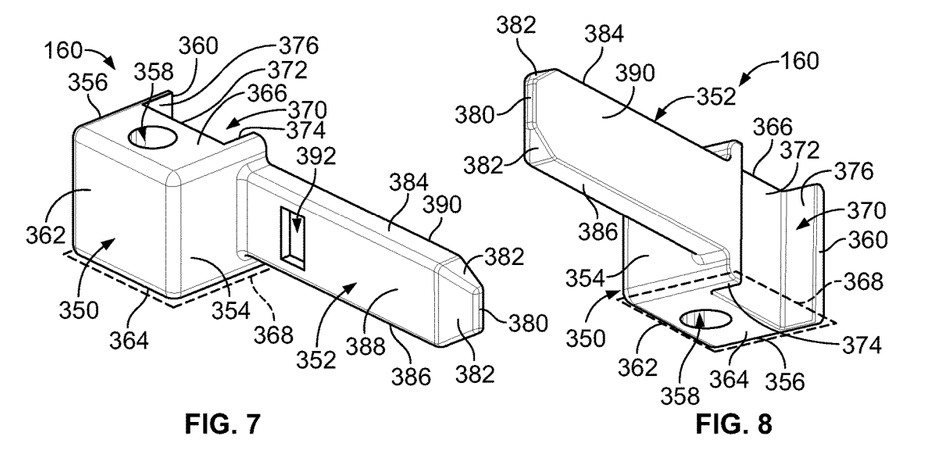
FIG. 7 is a bottom perspective view of support hardware for various card edge connector assemblies in accordance with an exemplary embodiment.
FIG. 8 is a perspective view of the support hardware shown in FIG. 7.

FIG. 7 is a bottom perspective view of the support hardware 160 in accordance with an exemplary embodiment. FIG. 8 is a perspective view of the support hardware 160 in accordance with an exemplary embodiment. Optionally, the first support hardware 160 may be identical to the second support hardware 162 (shown in FIG. 1) and thus features of the second support hardware 162 are described herein with reference to the first support hardware 160. For example, in an exemplary embodiment, the support hardware 160, 162 are hermaphroditic and may be coupled to either end of the card edge connector 130 (shown in FIG. 1). Alternatively, rather than being identical, the components may be designed with a right-hand version and a left-hand version, which may be mirrored versions, for coupling to the opposite ends of the card edge connector 130.

The support hardware 160 includes a base 350 configured to be mounted to the host circuit board 110 (shown in FIG. 1) and a support beam 352 extending from the base 350. In an exemplary embodiment, the support hardware 160 is horizontal support hardware configured to extend horizontally (for example, parallel to the host circuit board 110) and be coupled to the pluggable module 142 in a horizontal mating direction. The support beam 352 extends from a front 354 of the base 350. The front 354 is generally opposite a rear 356 of the base 350. The base 350 includes a bottom 364 configured to be mounted to the host circuit board 110 and a top 366 opposite the bottom 364. In an exemplary embodiment, the bottom 364 includes a mounting feature 358 for mounting the base 350 to the host circuit board 110. In the illustrated embodiment, the mounting feature 358 is a threaded opening configured to receive mounting hardware, such as a fastener, such as a threaded screw. Other types of mounting features may be provided in alternative embodiments, such as a non-threaded opening, a post, a barb, a solder feature, and the like.

The base 350 includes an inner end 360 configured to face the card edge connector 130 and an outer end 362 opposite the inner end 360 that extend between the bottom 364 and the top 366. The base 350 is generally box-shaped; however, the base 350 may have other shapes in alternative embodiments including other portions. The support hardware 160 has a footprint 368 defined by the bottom 364 between the ends 360, 362 and the front 354 and the rear 356 configured to occupy a space above the host circuit board 110. In an exemplary embodiment, the support beam 352 extends from the base 350 at or near the inner end 360 and the mounting feature 358 is provided at the bottom 364 near the outer end 362.

The base 350 includes a locating cavity 370 having one or more locating surfaces 372, 374, 376 configured to locate the support hardware 160 relative to the card edge connector 130. In an exemplary embodiment, the locating cavity 370 is provided at the inner end 360 and at the bottom 364. The locating cavity 370 is open at the inner end 360 and at the bottom 364 to receive a portion of the card edge connector 130. Optionally, the locating cavity may be open at the top 366. In the illustrated embodiment, the locating cavity 370 is generally rectangular in shape; however, the locating cavity 370 may have other shapes in alternative embodiments. In the illustrated embodiment, the locating cavity 370 includes an end locating surface 372, a first side locating surface 374 near the front 354 and a second side locating surface 376 near the rear 356. The locating surfaces 372, 374, 376 are configured to engage the card edge connector 130 to register the location of the support hardware 160 relative to the card edge connector 130. The side locating surfaces 374, 376 may guide side-to-side positioning of the support hardware 160 relative to the card edge connector 130. The end locating surface 372 may guide end-to-end positioning of the support hardware 160 relative to the card edge connector 130.

The support beam 352 extends from the base 350 to a distal end 380. The support beam 352 is used to guide mating of the pluggable module 142 to the support hardware 160. The support beam 352 supports the pluggable module 142 to alleviate stresses and strains on the card edge connector 130, such as from pulling on the cables 144 of the pluggable module 142 by transferring the stresses and strains to the base 350 and the host circuit board 110. In an exemplary embodiment, the support beam 352 includes a lead-in 382 at the distal end 380. For example, the support beam 352 may be chamfered along a first side 384, a second side 386, an outer end 388 and/or an inner end 390. The lead-in 382 at the first side 384 and/or the second side 386 may guide up-and-down positioning of the pluggable module 142 during mating. The lead-in 382 at the outer end 388 and/or the inner end 390 may guide end-to-end positioning of the pluggable module 142 during mating.

In an exemplary embodiment, the support beam 352 includes a latching feature 392 for securing the pluggable module 142 to the support hardware 160. In the illustrated embodiment, the latching feature 392 is an opening in the support beam 352 at the outer end 388. Other types of latching features may be provided in alternative embodiments, such as a deflectable latch extending from the support beam 352. The latching feature 392 may be located at a different position on the support beam 352 or may be located on the base 350 in alternative embodiments.

Figure 9:
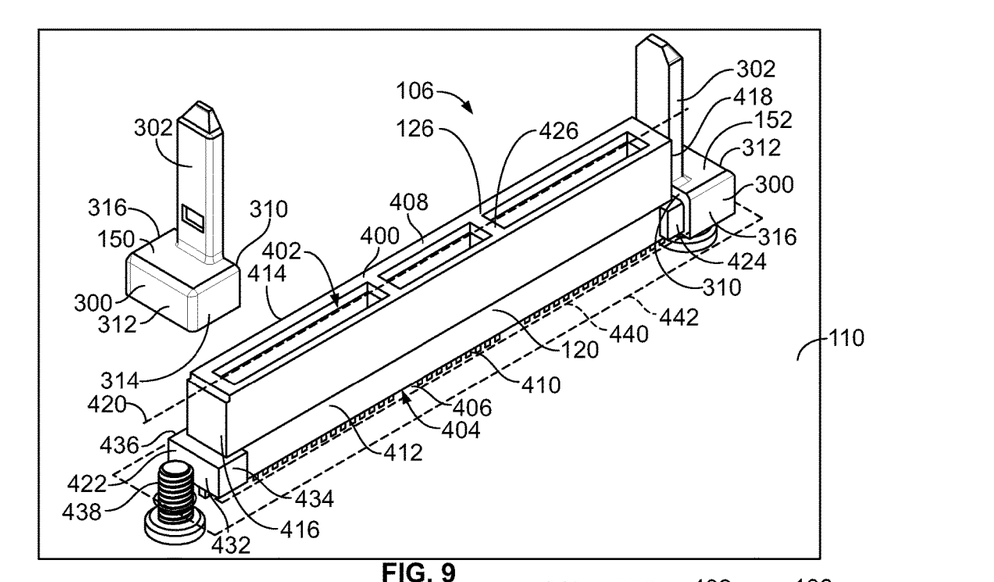
FIG. 9 is a perspective view of a portion of one of the card edge connector assemblies in accordance with an exemplary embodiment.
Figure 10:
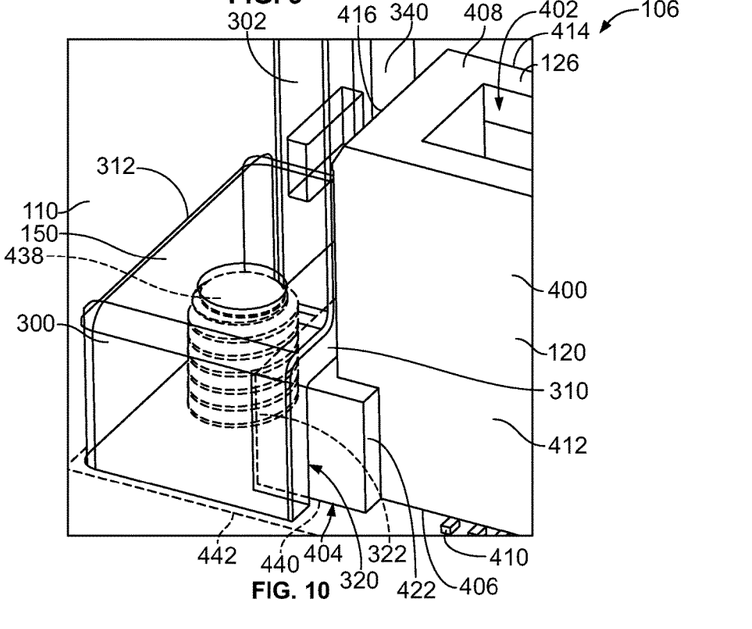
FIG. 10 is a perspective view of a portion of the card edge connector assembly shown in FIG. 9.

FIG. 9 is a perspective view of a portion of the card edge connector assembly 106 in accordance with an exemplary embodiment. FIG. 10 is a perspective view of a portion of the card edge connector assembly 106 in accordance with an exemplary embodiment. FIG. 9 shows the card edge connector 120 mounted to the host circuit board 110, the support hardware 152 coupled to the card edge connector 120 and the host circuit board 110 and the support hardware 150 poised for mounting to the card edge connector 120 and the host circuit board 110. FIG. 10 shows an end of the card edge connector 120 and the support hardware 150 coupled to the card edge connector 120 and the host circuit board 110.

The card edge connector 120 includes a housing 400 defining a card slot 402 at the mating end 126 configured to receive the paddle card 180 (shown in FIG. 3) of the cabled pluggable module 142 (shown in FIG. 3). The housing 400 has a base 404 configured to be mounted to the host circuit board 110. In the illustrated embodiment, the base 404 is provided at a bottom 406 and the card slot 402 is provided at a top 408. The housing 400 holds a plurality of contacts 410 in the card slot 402 to electrically connect to corresponding contact pads 184 of the paddle card 180. The contacts 410 are electrically connected to the host circuit board 110. For example, the contacts 410 may be soldered to the host circuit board 110. The housing 400 has a first side 412 and a second side 414 extending between a first end 416 and a second end 418. The support hardware 150, 152 is coupled to the first and second ends 416, 418, respectively. The sides 412, 414 are elongated along a longitudinal axis 420 between the ends 416, 418. The ends 416, 418 extend laterally between the sides 412, 414.

In an exemplary embodiment, the card edge connector 120 includes a first mounting lug 422 at the first end 416 and a second mounting lug 424 at the second end 418. The support hardware 150, 152 is configured to be coupled to the mounting lugs 422, 424. For example, the mounting lugs 422, 424 may be received in the locating cavities 320 of the support hardware 150, 152, respectively. Optionally, the mounting lugs 422, 424 may be used to support the housing 400 on the host circuit board 110. For example, solder clips or solder tails may extend from the mounting lugs 422, 424 that are configured to be soldered to the host circuit board 110 to secure the housing 400 to the host circuit board 110.

Optionally, the housing 400 may include alignment ribs 426 extending across the card slot 402 between the sides 412, 414. The alignment ribs 426 are used to align the paddle card 180 in the card slot 402.

In an exemplary embodiment, the housing 400 includes one or more datum surfaces 432, 434, 436 for locating the support hardware 150, 152 relative to the housing 400. For example, the mounting lugs 422, 424 may include datum surfaces. In the illustrated embodiment, each mounting lug 422, 424 includes an end datum surface 432, a first side datum surface 434 and a second side datum surface 436. The datum surfaces 432, 434, 436 are configured to engage the corresponding support hardware 150, 152 to register the location of the support hardware 150, 152 relative to the card edge connector 120. For example, the datum surfaces 432, 434, 436 register the location of the support hardware 150, 152 relative to the mounting lugs 422, 424, respectively. The side datum surfaces 434, 436 may guide side-to-side positioning of the support hardware 150, 152 relative to the card edge connector 120. The end datum surface 432 may guide end-to-end positioning of the support hardware 150, 152 relative to the card edge connector 120.

Optionally, when the end datum surface 432 engages the end locating surface 322, a gap or space may be provided between the inner end 310 of the base 300 and/or the inner end 340 of the support beam 302 and the ends 416, 418 of the housing 400. As such, the ends 416, 418 do not block positioning of the support hardware 150, 152 on the mounting lugs 422, 424. Optionally, the support beams 302 may be able to flex or move without engaging and causing stresses or strains to be transferred to the housing 400. Optionally, a space may be provided above the mounting lugs 422, 424 in the locating cavities 320 to allow the support hardware 150, 152 to flex and move without engaging and causing stresses or strains to be transferred to the housing 400.

In an exemplary embodiment, mounting hardware 438, such as a threaded fastener, is used to secure the base 300 to the host circuit board 110. For example, the mounting hardware 438 may be loaded through the host circuit board 110 from below the host circuit board 110 to secure to the base 300 from below. The mounting hardware 438 may secure the base 300 to the host circuit board 110 such that stresses or strains induced in the support hardware 150 or 152 from the cabled pluggable module 142 are transferred to the host circuit board 110 through the mounting hardware 438.

In an exemplary embodiment, the mounting hardware 438 vertically fixes the base 300 to the host circuit board 110 such that the base 300 is unable to move vertically (for example, up and down, relative to the host circuit board 110). Optionally, the opening in the host circuit board 110 that receives the mounting hardware 438 may be oversized to allow the mounting hardware 438 to move within the opening, such as to align with the mounting feature 308 of the support hardware 150, 152. For example, the mounting hardware 438 and the base 300 may have a limited amount of floating movement relative to the host circuit board 110 in a horizontal plane parallel to the host circuit board 110 to allow the mounting hardware 438 to locate relative to the mounting feature 308 and/or to allow the base 300 to locate relative to the mounting lug 422, 424. As such, the support hardware 150, 152 may be registered to the housing 400 of the card edge connector 120 at a designated support location as opposed to being located by the openings in the host circuit board 110. The housing 400 may have tighter tolerances than the openings in the host circuit board 110 for proper positioning of the support hardware 150, 152 at the appropriate support locations and it may be beneficial to locate the support hardware 150, 152 to the housing 400 rather than the host circuit board 110 via the openings. The relative positions of the support hardware 150, 152 may be precisely controlled and registered to the housing 400 to ensure that the support beams 302 of the support hardware 150, 152 are properly located for guiding and supporting the pluggable module 142.

In an exemplary embodiment, the card edge connector 120 is usable in different configurations. For example, in a first configuration, the card edge connector 120 may be coupled to the host circuit board 110 without the use of the support hardware 150, 152, thus defining the card edge connector assembly 102 (shown in FIG. 1). The housing 400 is used to support the paddle card 170 of the non-cabled pluggable module 122 (both shown in FIG. 1). Because the non-cabled pluggable module 122 tends to be static and not move around (as opposed to the cabled pluggable module 142), there is little need for additional support provided by the support hardware 150, 152. By alleviating the support hardware 150, 152 the card edge connector assembly 102 has a first footprint 440 above the host circuit board 110 having a first surface area defined substantially by the footprint of the housing 400 (for example, the area between the sides 412, 414 and the ends 416, 418).

However, in a second configuration as in the illustrated embodiment, the card edge connector 120 is coupled to the host circuit board 110 with the addition of the support hardware 150, 152, thus defining the card edge connector assembly 106. Because the cabled pluggable module 142 tends to move around, such as when the cables 144 are manipulated or pulled, there is need for additional support to ensure that the card edge connector 120 is not damaged. Excessive movement of the card edge connector 120 may cause the contacts 410 to separate from the host circuit board 110. For example, the solder between the contacts 410 and the host circuit board 110 may break causing electrical shorts. The support hardware 150, 152 is coupled to the card edge connector 120 and the host circuit board 110 to alleviate stresses and strains on the card edge connector 120. For example, the cabled pluggable module 142 is mounted to the support beams 302 of the support hardware 150, 152 and movement of the cabled pluggable module 142 is transferred from the support beams 302 to the bases 300 and to the host circuit board 110 through the mounting hardware 438.

The addition of the support hardware 150, 152 increases the footprint. For example, the card edge connector assembly 106 has a second footprint 442 having a second surface area larger than the surface area of the first footprint 440. The second footprint 442 is defined substantially by the footprints of the support hardware 150, 152 with the footprint of the housing 400 therebetween. For example, the footprint 442 is defined by the area between the outer ends 312 of the bases 300 and the sides 314, 316 of the bases 300.

The footprint 442 is longer and wider than the footprint 440. Because the real estate of the host circuit board 110 is valuable, when the electrical system 100 does not have need for the cabled pluggable modules 142, the system architecture may utilize the card edge connector assemblies 102 rather than the card edge connector assemblies 106. For example, because the card edge connector assemblies 102 have smaller footprints 440 than the footprints 442 of the card edge connector assemblies 106, tighter positioning of the card edge connector assemblies may be achieved and/or closer placement of other components on the host circuit board 110 to the card edge connector assemblies 102 may be allowed and/or the use of a smaller host circuit board 110 may be implemented. However, when the electrical system 100 has need for the cabled pluggable modules 142, the support hardware 150, 152 may be utilized with the card edge connectors 120 to provide additional support. By utilizing the same card edge connector 120 with the card edge connector assembly 102 and the card edge connector assembly 106, the overall cost of the system may be reduced by eliminating tooling and part costs.

Figure 11:
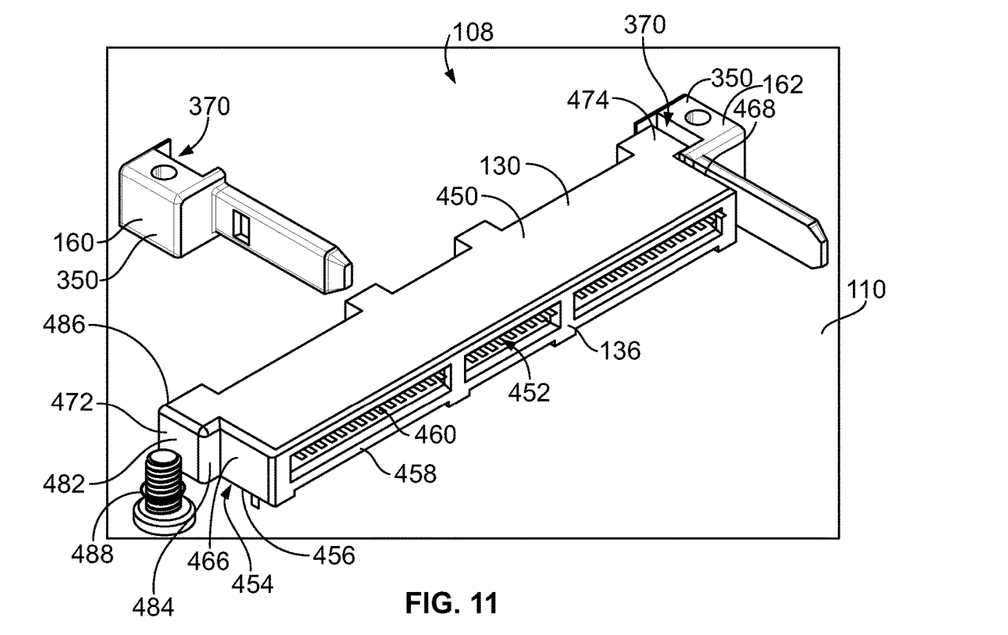
FIG. 11 is a perspective view of a portion of one of the card edge connector assemblies in accordance with an exemplary embodiment.
Figure 12:
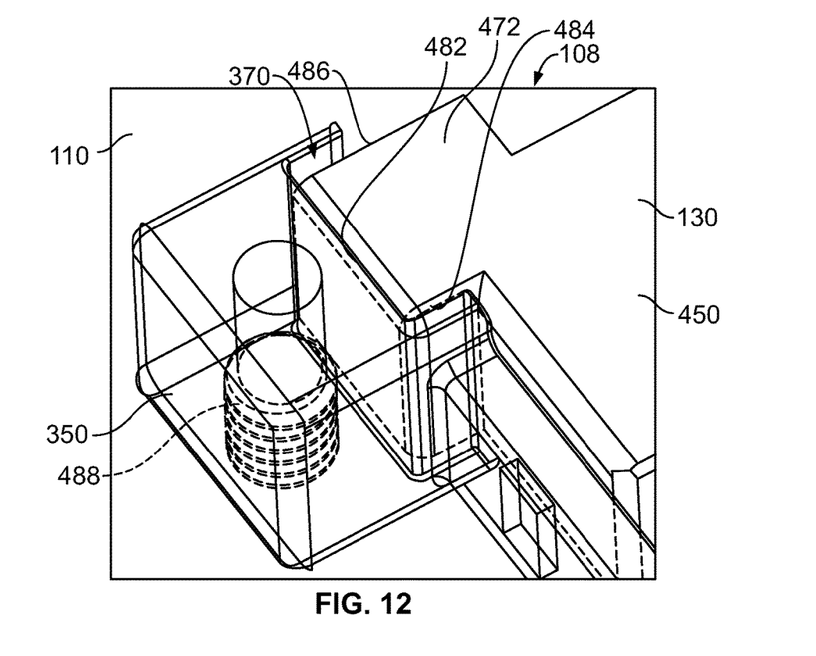
FIG. 12 is a perspective view of a portion of the card edge connector assembly shown in FIG. 11.

FIG. 11 is a perspective view of a portion of the card edge connector assembly 108 in accordance with an exemplary embodiment. FIG. 12 is a perspective view of a portion of the card edge connector assembly 108 in accordance with an exemplary embodiment. FIG. 11 shows the card edge connector 130 mounted to the host circuit board 110, the support hardware 162 coupled to the card edge connector 130 and the host circuit board 110 and the support hardware 160 poised for mounting to the card edge connector 130 and the host circuit board 110. FIG. 12 shows an end of the card edge connector 130 and the support hardware 160 coupled to the card edge connector 130 and the host circuit board 110.

The card edge connector 130 includes a housing 450 defining a card slot 452 at the mating end 136 configured to receive the paddle card 180 (shown in FIG. 3) of the cabled pluggable module 142 (shown in FIG. 3). The housing 450 has a base 454 configured to be mounted to the host circuit board 110. In the illustrated embodiment, the base 450 is provided at a bottom 456 and the card slot 452 is provided at a front 458. The housing 450 holds a plurality of contacts 460 in the card slot 452 to electrically connect to corresponding contact pads 184 of the paddle card 180. The contacts 460 are right angle contacts extending generally horizontally at the mating end 136 and generally vertically at the bottom 456 to terminate to the host circuit board 110. The housing 450 extends between a first end 466 and a second end 468. The support hardware 160, 162 is coupled to the first and second ends 466, 468, respectively.

In an exemplary embodiment, the card edge connector 130 includes a first mounting lug 472 at the first end 466 and a second mounting lug 474 at the second end 468. The support hardware 160, 162 is configured to be coupled to the mounting lugs 472, 474. For example, the mounting lugs 472, 474 may be received in the locating cavities 370 of the support hardware 160, 162, respectively.

In an exemplary embodiment, the housing 450 includes one or more datum surfaces 482, 484, 486 for locating the support hardware 160, 162 relative to the housing 450. For example, the mounting lugs 472, 474 may include datum surfaces. In the illustrated embodiment, each mounting lug 472, 474 includes an end datum surface 482, a first side datum surface 484 and a second side datum surface 486. The datum surfaces 482, 484, 486 are configured to engage the corresponding support hardware 160, 162 to register the location of the support hardware 160, 162 relative to the card edge connector 130. For example, the datum surfaces 482, 484, 486 register the location of the support hardware 160, 162 relative to the mounting lugs 472, 474, respectively. The side datum surfaces 484, 486 may guide side-to-side positioning of the support hardware 160, 162 relative to the card edge connector 130. The end datum surface 482 may guide end-to-end positioning of the support hardware 160, 162 relative to the card edge connector 130.

In an exemplary embodiment, mounting hardware 488, such as a threaded fastener, is used to secure the base 350 to the host circuit board 110. For example, the mounting hardware 488 may be loaded through the host circuit board 110 from below the host circuit board 110 to secure to the base 350 from below. The mounting hardware 488 may secure the base 350 to the host circuit board 110 such that stresses or strains induced in the support hardware 160 or 162 from the cabled pluggable module 142 is transferred to the host circuit board 110 through the mounting hardware 488.

In an exemplary embodiment, the card edge connector 130 is usable in different configurations. For example, in a first configuration, the card edge connector 130 may be coupled to the host circuit board 110 without the use of the support hardware 160, 162, thus defining the card edge connector assembly 104 (shown in FIG. 1). However, in a second configuration, the card edge connector 130 is coupled to the host circuit board 110 with the addition of the support hardware 160, 162, thus defining the card edge connector assembly 108. Because the cabled pluggable module 142 tends to move around, such as when the cables 144 are manipulated or pulled, there is need for additional support to ensure that the card edge connector 130 is not damaged. The support hardware 160, 162 is coupled to the card edge connector 130 and the host circuit board 110 to alleviate stresses and strains on the card edge connector 130. The addition of the support hardware 160, 162 increases the footprint.

Figure 13:
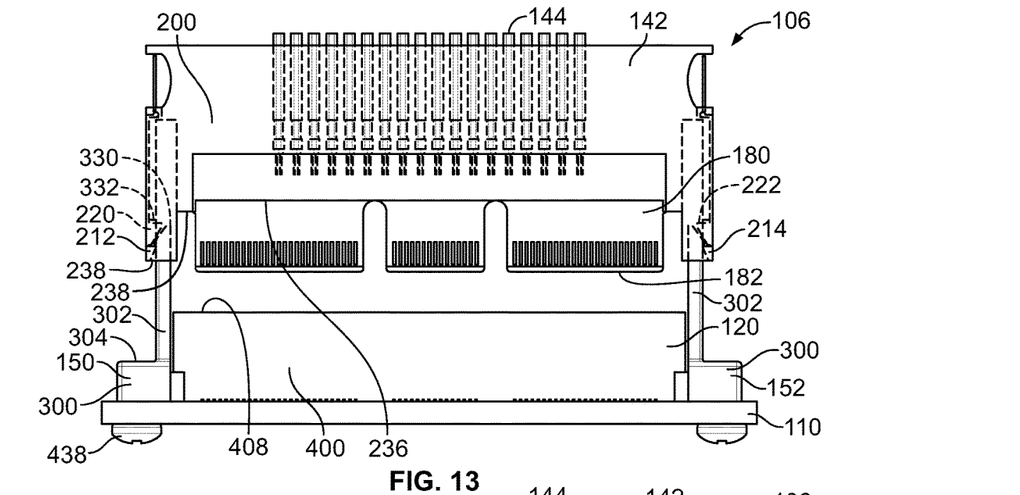
FIG. 13 is a side view of the card edge connector assembly showing the cabled pluggable module partially mated with the support hardware in accordance with an exemplary embodiment.
Figure 14:
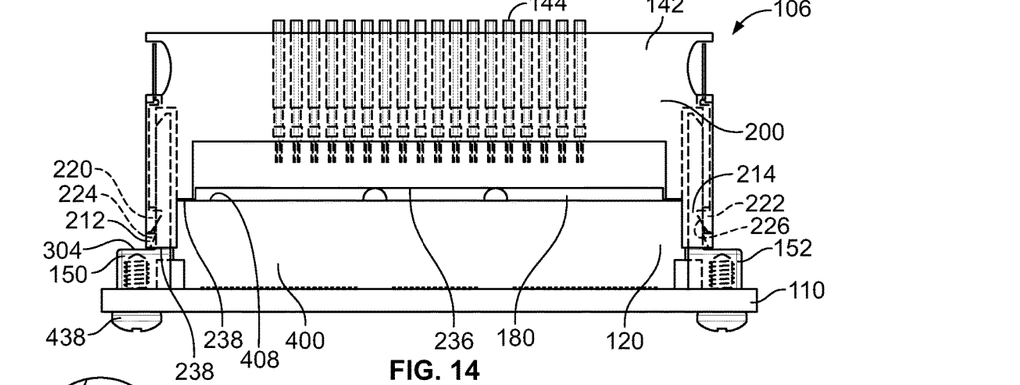
FIG. 14 is a side view of the card edge connector assembly showing the cabled plug module mated with the support hardware and the card edge connector in accordance with an exemplary embodiment.

FIG. 13 is a side view of the card edge connector assembly 106 showing the cabled pluggable module 142 partially mated with the support hardware 150, 152 above the card edge connector 120. FIG. 14 is a side view of the card edge connector assembly 106 showing the cabled plug module 142 mated with the support hardware 150, 152 and the card edge connector 120. As the pluggable module 142 is mated, the pluggable module 142 is coupled to the support beams 302 of the support hardware 150, 152. For example, the support beams 302 are coupled to the mounting arms 212, 214. In the illustrated embodiment, the support beams 302 are received in the tracks 216, 218 (shown in FIG. 3) of the mounting arms 212, 214, respectively.

During mating, the support beams 302 guide mating of the pluggable module 142 with the card edge connector 120. For example, the support beams 302 locate the pluggable module 142 above the card edge connector 120 in proper alignment with the card slot 402 (shown in FIG. 9). The support hardware 150, 152 is registered to the housing 400 of the card edge connector 120 to align the pluggable module 142 with the card edge connector 120. The lead-ins 332 at the distal ends 330 of the support beams 302 guide the pluggable module 142 into alignment. As the pluggable module 142 is lowered in the mating direction toward the card edge connector 120, the card edge 182 of the paddle card 180 is eventually received in the card slot 402. The pluggable module 142 is mated until the pluggable module 142 is seated against the support hardware 150, 152 and/or the housing 400. For example, the front stop surfaces 238 at the distal ends of the mounting arms 212, 214 bottom out against the tops 304 of the bases 300 of the support hardware 150, 152 and/or the front stop surfaces 238 at the shoulders near the front edge 236 bottom out against the top 408 of the housing 400. In various embodiments, the front stop surfaces 238 only engage the support hardware 150, 152 and do not engage the housing 400 to reduce transfer of forces to the card edge connector 120. For example, in various embodiments, no portion of the pluggable body 200 engages the housing 400. In the mated position, the latches 220, 222 are configured to be coupled to the support beams 302. For example, the latching ends 224, 226 are coupled to the latching features 342 of the support hardware 150, 152.

When mated, movement of the pluggable module 142, such as from pulling on the cables 144, is transferred to the support hardware 150, 152. The forces from the movement are transferred to the support beams 302 into the bases 300 and to the host circuit board 110 through the mounting hardware 438. The forces largely bypass the card edge connector 120 such that stresses and strains to the card edge connector 120 are minimal. The support beams 302 tend to rigidly hold the pluggable module 142 to resist the pulling forces on the cables 144. The support beams 302 provide mechanical support at a location remote from the card edge connector 120 such as a vertical distance above the card edge connector 120. In an exemplary embodiment, the support hardware 150, 152 is optional hardware that may be removably and selectively coupled to the housing 400 and the host circuit board 110 depending on the system requirements. For example, in some configurations, such as when cable pluggable modules are not utilized, the support hardware 150, 152 may be eliminated and the same card edge connector 120 may be coupled to the host circuit board 110 for receiving the non-cabled pluggable module 122 (shown in FIG. 1).

Figure 15:
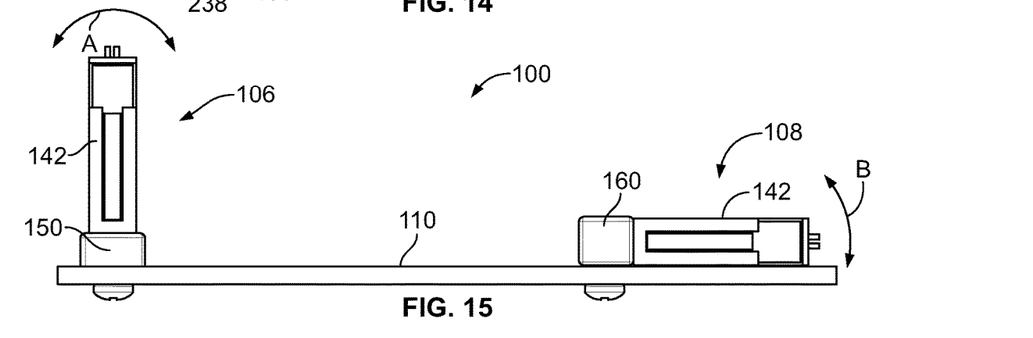
FIG. 15 is an end view of the electrical system showing various card edge connector assemblies mounted to a host circuit board.

FIG. 15 is an end view of the electrical system 100 showing the card edge connector assembly 106 and the card edge connector assembly 108 mounted to the host circuit board 110. The support hardware 150 supports the cabled pluggable module 142 and resists movement of the pluggable module 142, such as in the direction of arrow A. The support hardware 160 supports the cabled pluggable module 142 and resists movement of the pluggable module 142, such as in the direction of arrow B.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A card edge connector assembly comprising:
a card edge connector having a housing defining a card slot extending along a longitudinal axis being configured to receive a paddle card of a pluggable module, the housing having a base configured to be mounted to a host circuit board, the housing holding contacts in the card slot to electrically connect to the paddle card, the contacts being configured to be electrically connected to the host circuit board, the housing having a mounting lug having a datum surface; and
a support hardware coupled to the housing, the support hardware having a base including a locating cavity having a locating surface, the locating cavity receiving the mounting lug, the locating surface engaging the datum surface of the mounting lug to locate the support hardware relative to the housing at a support location, the base having a mounting feature being configured to be secured to the host circuit board at the support location, the mounting feature being axially aligned with the longitudinal axis of the card slot, the support hardware having a support beam extending from the base, the support beam having an outer end facing away from the card edge connector defining a support surface configured to directly engage and support the pluggable module independent of the card edge connector such that the paddle card is oriented in the card slot relative to the contacts for electrical connection therewith.

2. The card edge connector assembly of claim 1, wherein the support hardware registers the pluggable module relative to the card edge connector and supports the pluggable module to hold the paddle card relative to the contacts.

3. The card edge connector assembly of claim 1, wherein the support hardware is registered to the housing by the locating surface engaging the datum surface.

4. The card edge connector assembly of claim 1, wherein the base of the support hardware is secured to the host circuit board independent of the card edge connector.

5. The card edge connector assembly of claim 1, wherein the base of the support hardware is secured to the host circuit board by a fastener such that the fastener and the base have a limited amount of floating movement relative to the host circuit board in a horizontal plane parallel to the host circuit board to allow the base to locate relative to the mounting lug, the fastener being configured to fix the base in a vertical direction perpendicular to the host circuit board.

6. The card edge connector assembly of claim 1, wherein the datum surface is an end datum surface, the mounting lug having a side datum surface perpendicular to the end datum surface, the locating surface of the support hardware being an end locating surface, the support hardware having a side locating surface perpendicular to the end locating surface engaging the side datum surface.

7. The card edge connector assembly of claim 6, wherein the mounting lug further comprises a second side datum surface on an opposite side of the mounting lug from the other side datum surface, the support hardware further comprising a second side locating surface on an opposite side of the locating cavity from the other side locating surface engaging the second side datum surface.

8. The card edge connector assembly of claim 1, wherein the support beam extends vertically above the base of the support hardware to receive the pluggable module in a mating direction perpendicular to the host circuit board.

9. The card edge connector assembly of claim 1, wherein the support beam extends from the base of the support hardware generally parallel to the host circuit board.

10. The card edge connector assembly of claim 1, wherein the support beam includes a latching feature configured to latchably secure the pluggable module to the support hardware.

11. The card edge connector assembly of claim 1, wherein the support hardware includes a stop surface for stopping mating of the pluggable module relative to the card edge connector.

12. The card edge connector assembly of claim 1, wherein the support hardware transfers forces from the pluggable module to the host circuit board independent of the card edge connector.

13. The card edge connector assembly of claim 1, wherein the support hardware is a first support hardware coupled to a first end of the housing, the card edge connector assembly further comprising a second support hardware coupled to a second end of the housing.

14. The card edge connector assembly of claim 13, wherein the first support hardware and the second support hardware are identical.

15. The card edge connector assembly of claim 1, wherein the support beam includes an inner end facing the card edge connector, the outer end opposite the inner end, the outer end defining a guide surface for guiding mating of the pluggable module with the card edge connector.

16. The card edge connector assembly of claim 15, wherein the support beam includes a latching feature along the outer end for interfacing with the pluggable module and securing the pluggable module to the support beam.

17. The card edge connector assembly of claim 1, wherein the base extends over a top of the locating cavity to cover a top of the mounting lug of the card edge connector.

18. A card edge connector assembly comprising:
a pluggable module having a pluggable body holding a paddle card at a mating end of the pluggable body, the paddle card having a card edge including contact pads, the pluggable body having a first side and a second side extending between a first end and a second end, the pluggable body having a first mounting arm at the first end and a second mounting arm at the second end, the first mounting arm includes a first track and the second mounting arm includes a second track;
a card edge connector having a housing defining a card slot receiving the card edge of the paddle card, the housing having a base configured to be mounted to a host circuit board, the housing holding contacts in the card slot to electrically connect to corresponding contact pads of the paddle card, the contacts being configured to be electrically connected to the host circuit board, the housing having a first side and a second side extending between a first end and a second end, the housing having a first mounting lug at the first end and a second mounting lug at the second end, the first mounting lug having a first datum surface, the second mounting lug having a second datum surface;
a first support hardware coupled to the first mounting lug, the first support hardware having a base including a locating cavity having a first locating surface, the locating cavity receiving the first mounting lug, the first locating surface engaging the first datum surface to locate the first support hardware relative to the housing at a first support location, the base being configured to be secured to the host circuit board at the first support location, the first support hardware having a first support beam extending from the base having a first support surface engaging the first mounting arm of the pluggable body to support the first end of the pluggable body; and
a second support hardware coupled to the second mounting lug, the second support hardware having a base including a locating cavity having a second locating surface, the locating cavity receiving the second mounting lug, the second locating surface engaging the second datum surface to locate the second support hardware relative to the housing at a second support location, the base being configured to be secured to the host circuit board at the second support location, the second support hardware having a second support beam extending from the base having a second support surface engaging the second mounting arm of the pluggable body to support the second end of the pluggable body;
wherein the first track receives the first support beam and the second track receives the second support beam; and
wherein the first and second support beams support the pluggable module independent of the card edge connector.

19. The card edge connector assembly of claim 18, wherein the pluggable module includes a first latch at the first end latchably coupled to a latching feature of the first support hardware and a second latch at the second end latchably coupled to a latching feature of the second support hardware.

20. The card edge connector assembly of claim 18, wherein the first support hardware and the second support hardware are positioned to have a tighter tolerance than the card edge connector for locating the pluggable module.

21. The card edge connector assembly of claim 18, wherein the first and second support surfaces are first and second end support surfaces engaging the first and second arms to hold an end-to-end position of the pluggable module, the first support hardware having a first side support surface and the second support hardware has a second side support surface, the first and second side support surfaces engaging the first and second arms, respectively, to hold a side-to-side position of the pluggable module.

22. The card edge connector assembly of claim 18, wherein the card slot extends along a longitudinal axis, the first and second mounting lugs being axially aligned along the longitudinal axis, the base of the first support hardware includes a first mounting feature, the base of the second support hardware includes a second mounting feature, the first and second mounting features being aligned along the longitudinal axis.

23. A card edge connector assembly having at least a first configuration and a second configuration, the card edge connector assembly comprising:
a card edge connector having a housing defining a card slot extending along a longitudinal axis being configured to receive a paddle card of a pluggable module, the housing having a base configured to be mounted to a host circuit board, the housing holding contacts in the card slot to electrically connect to the paddle card, the contacts being configured to be electrically connected to the host circuit board, the housing having a mounting lug having a datum surface; and
support hardware removably and selectively coupled to the housing, wherein, in the first configuration, the support hardware is removed from the housing and not utilized and, in the second configuration, the support hardware is coupled to the housing, the support hardware having a base including a locating cavity having a locating surface, the locating cavity receiving the mounting lug in the second configuration such that the locating surface engages the datum surface of the mounting lug to locate the support hardware relative to the housing at a support location, the base having a mounting feature being configured to be coupled to the host circuit board at the support location, the mounting feature being axially aligned with the longitudinal axis of the card slot, the support hardware having a support beam extending from the base, the support beam having an outer end facing away from the card edge connector defining a support surface configured to directly engage and support the pluggable module independent of the card edge connector such that the paddle card is oriented in the card slot relative to the contacts for electrical connection therewith in the second configuration;

wherein, in the first configuration, the card edge connector assembly has a first footprint above the host circuit board having a first surface area defined substantially by a footprint of the housing, and wherein, in the second configuration when the support hardware is coupled to the housing, the card edge connector assembly has a second footprint above the host circuit board having a second surface area defined substantially by the footprint of the housing and a footprint of the support hardware such that the second surface area is larger than the first surface area; and wherein, in the first configuration, the card edge connector is configured to be coupled to a non-cabled pluggable module with the non-cabled pluggable module engaging and being supported by the card edge connector and, in the second configuration, the card edge connector is configured to be coupled to a cabled pluggable module with the cabled pluggable module engaging and being supported by the support hardware independent of the card edge connector.

* * * * *